United States Patent
Wu et al.

(10) Patent No.: US 8,224,598 B2
(45) Date of Patent: Jul. 17, 2012

(54) METHOD FOR FORMING OPTIMAL CHARACTERISTIC CURVES OF SOLAR CELL AND SYSTEM THEREOF

(75) Inventors: Teng Chun Wu, Hsinchu (TW); Bor Nian Chuang, Taichung (TW); Jang Shii Song, Hsinchu (TW); Hung Sen Wu, Taoyuan County (TW); Yean San Long, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 760 days.

(21) Appl. No.: 12/171,954

(22) Filed: Jul. 11, 2008

(65) Prior Publication Data

US 2009/0234601 A1 Sep. 17, 2009

(30) Foreign Application Priority Data

Mar. 12, 2008 (TW) ............................... 97108625 A

(51) Int. Cl.
*G01R 19/00* (2006.01)

(52) U.S. Cl. ............... 702/64; 702/66; 702/81; 702/182

(58) Field of Classification Search ............... 702/64, 702/66, 81, 182; 324/761.01; 323/906; 320/101; 368/205

See application file for complete search history.

(56) References Cited

U.S. PATENT DOCUMENTS

| | | | |
|---|---|---|---|
| 4,528,503 A | 7/1985 | Cole | |
| 7,087,332 B2 * | 8/2006 | Harris | 429/432 |
| 7,777,446 B2 * | 8/2010 | Ueda et al. | 320/104 |

OTHER PUBLICATIONS

Mariam et al. 'Influence of Malaysian Climate on the Efficiency of Polycrystalline Solar Cells', 2006, PECon Publication, pp. 54-57.*

* cited by examiner

*Primary Examiner* — Michael Nghiem
*Assistant Examiner* — Elias Desta
(74) *Attorney, Agent, or Firm* — WPAT, P.C.; Anthony King

(57) ABSTRACT

The method for forming the optimal characteristic curve of a solar cell comprises the steps of: providing a first acceptable error; and determining a current-voltage polynomial regression equation, whose square root of the residual sum of square is less than the first acceptable error for a set of solar cell measured data. The order of the current-voltage polynomial regression equation is gradually increased until the square root of the residual sum of square of the current-voltage polynomial regression equation is less than the first acceptable error.

18 Claims, 5 Drawing Sheets

METHOD FOR FORMING OPTIMAL CHARACTERISTIC CURVES OF SOLAR CELL AND SYSTEM THEREOF

BACKGROUND OF THE INVENTION

1. Field of the Invention

The present invention relates to a method for forming optimal characteristic curves of a solar cell and the system thereof in an automatic manner.

2. Description of the Related Art

With the gradual exhaustion of oil reserves and other non-renewable energy resources and more concern toward environmental protection, the development of alternative energy resources draws more and more attention from many governments. Among the alternatives for future energy sources, the development of solar cells is one of the most attractive solutions. Many countries are applying extensive effort toward developing this technology so as to reduce their heavy reliance on oil or other non-renewable resources.

Using a solar cell to transform solar energy into electricity is the primary basis of collecting solar energy. The principle activity of a solar cell is to use semiconductor photoelectrical transformation to generate electrical power. The transformation efficiency will directly affect the output power and, therefore, the selling price of the solar cell. Generally, solar cells are classified into different classes based on their efficiency testing. It is expected that higher transformation efficiency in a solar cell corresponds to a higher price. Therefore, an accurate, objective and rapid measuring method or system is an important tool for solar cell manufacturers.

U.S. Pat. No. 4,528,503 discloses a method and apparatus for measuring current and voltage of a solar cell. This method measures characteristic curves of the solar cells while in the states of open and closed circuits, respectively, and the voltage and current of the maximal output power are deduced from the measured data.

Other methods of determining the maximal output power utilize mostly human operations to read operation data and then manually select a linear or fixed square root equation to find voltage and current curves. However, such method is so subjective that the analysis result is not reliable.

SUMMARY OF THE INVENTION

The proposed method for forming an optimal characteristic curve of a solar cell comprises the steps of: providing a first allowable error; then, determining a current-voltage polynomial regression equation in accordance with measured data of the solar cell, wherein the curve-fitting error of the current-voltage polynomial regression equation is smaller than the first allowable error.

The proposed method for forming an optimal characteristic curve of a solar cell comprises the steps of: providing a first allowable error; determining a current-voltage polynomial regression equation with a minimal curve-fitting error from all current-voltage polynomial regression equations with curve-fitting errors smaller than the first allowable error; calculating characteristic parameters including open voltage and short current; estimating a power-voltage polynomial regression equation; and estimating maximal power voltage, maximal power and maximal power current.

The proposed system for forming an optimal characteristic curve of a solar cell comprises a current-voltage polynomial regression module, a characteristic parameter calculation module, a temperature coefficient calculation module, an internal in-series resistance calculation module and a characteristic parameter transformation module. The current-voltage polynomial regression module is configured to determine polynomial regression equations with errors smaller than an allowable error in accordance with measured data of the solar cell. The characteristic parameter calculation module is configured to calculate characteristic parameters including open voltage and short current in accordance with the current-voltage polynomial regression equations. The temperature coefficient calculation module is configured to calculate temperature coefficients on the basis of the relationship of dimensionless characteristic parameters and temperature as well as illumination, wherein the dimensionless characteristic parameters are determined by conducting a dimensionless analysis on the measured data of the solar cell in accordance with the characteristic parameters. The internal in-series resistance calculation module is configured to calculate internal in-series resistance in accordance with the short current and voltage corresponding to the short current at different illumination conditions. The characteristic parameter transformation module is configured to transform the measured data and/or characteristic parameters of the solar cell into a standard test condition.

BRIEF DESCRIPTION OF THE DRAWINGS

The invention will be described according to the appended drawings in which.

DESCRIPTION OF THE EMBODIMENTS

The method of the present invention takes advantage of regression equations and the optimization method thereof to achieve the purpose of automatic calculations, and utilizes the generated curve to calculate related characteristic parameters of the solar cells. The present invention exhibits such high levels of objectivity, automation and accuracy that many of the prior art's problems in measuring solar cells can be avoided. The measuring system using the algorithm of the present invention can achieve the objectives of standard test retroaction and can increase the measuring speed.

Figure 1:
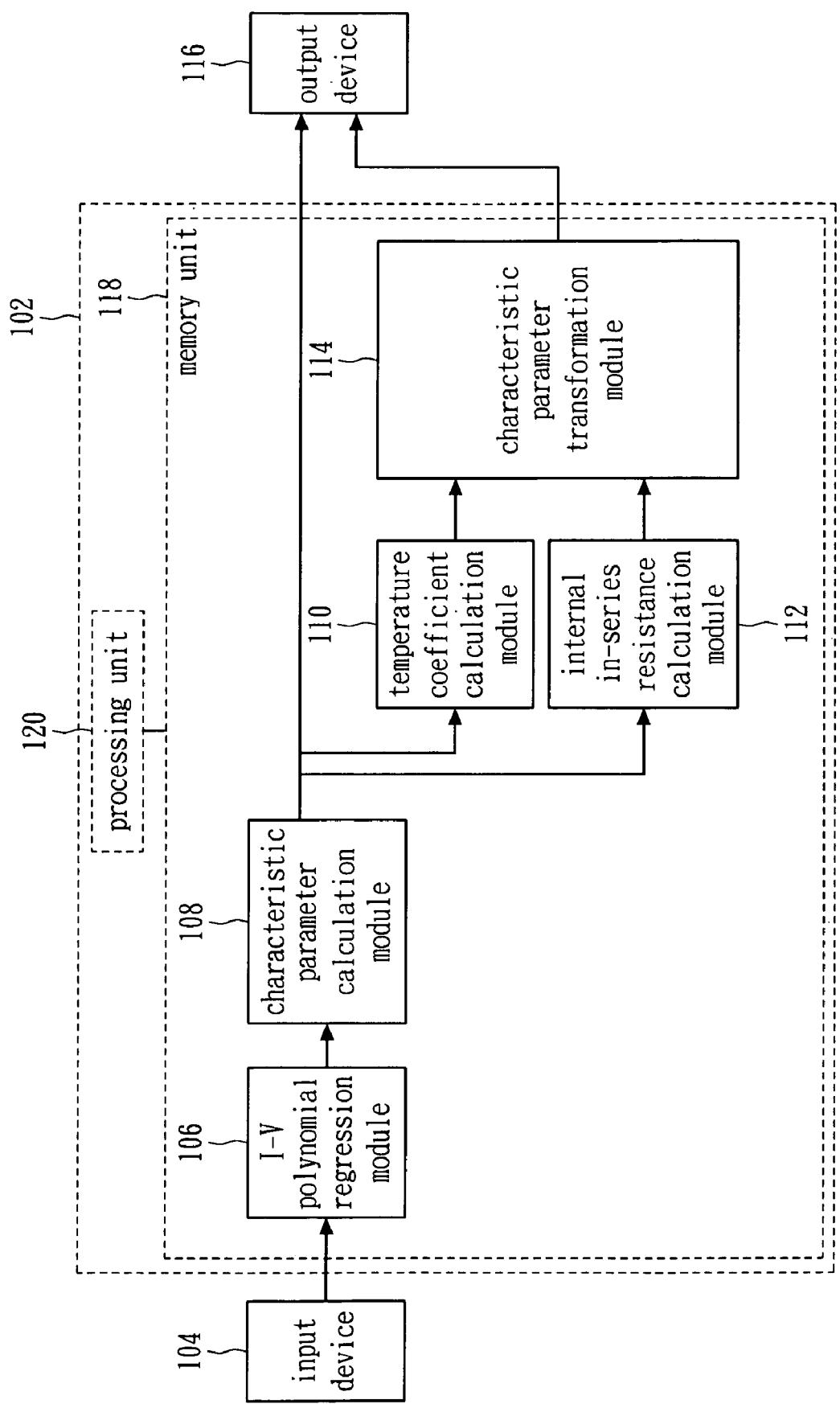
FIG. 1 shows a system capable of forming optimal characteristic curves of solar cells in accordance with one embodiment of the present invention.

FIG. 1 shows a system capable of forming optimal characteristic curves of solar cells in accordance with one embodiment of the present invention. A characteristic curve calculation apparatus 102 comprises a processor 120 and a memory unit 118. The memory unit 118 stores a current-voltage (I-V) polynomial regression module 106, a characteristic parameter calculation module 108, a temperature coefficient calculation module 110, an internal equivalent in-series resistance calculation module 112 and a characteristic parameter transformation module 114. The in-series operations of these calculation modules render the characteristic curve calculation apparatus 102 objective, automatic, accurate and reproducible. The input device 104 stores solar cell measured data, which includes current, voltage, temperature and illumination, and so on. The input device 104 includes long-term storing devices such as hard disk, DVD-R, or registers connected to the measuring equipment. The registers can be volatile or non-volatile. The data stored in the input device 104 is obtained either indoors or outdoors. The I-V polynomial regression module 106 determines a current-voltage polynomial regression equation whose square root of the residual sum of square is less than an acceptable error for a set of measured data for the solar cell. The characteristic parameter calculation module 108 calculates open circuit voltage $V_{oc}$, short circuit current $I_{sc}$, maximal power current $I_{mp}$ and maximal power voltage $V_{mp}$. The temperature coefficient calculation module 110 utilizes detected current, voltage and temperature to calculate the relationship between measured characteristic parameters of the solar cells in different temperatures. In practice, the principle uses characteristic parameters to render the current and voltage dimensionless, and then uses the dimensionless current and voltage to generate an optimal dimensionless I-V polynomial regression equation. Subsequently, dimensionless characteristic parameters and their corresponding temperature coefficients based on the relationship with temperature as well as illumination are calculated. The internal in-series resistance calculation module 112 calculates internal equivalent in-series resistance of the solar cell based on the short current and voltage corresponding to the short current at different illumination conditions. The characteristic parameter transformation module 114 uses temperature coefficients and internal equivalent in-series resistance to transform the measured data and/or characteristic parameters of the solar cells into a standard test condition (STC) so as to remain in a fair measuring condition. The calculation results of the characteristic parameter calculation module 108 and characteristic parameter transformation module 114 are output to the output device 116, which may be a printer or a monitor. The above calculations are stored in the memory unit 118 from which the processor 120 runs the calculation instructions.

Figure 2:
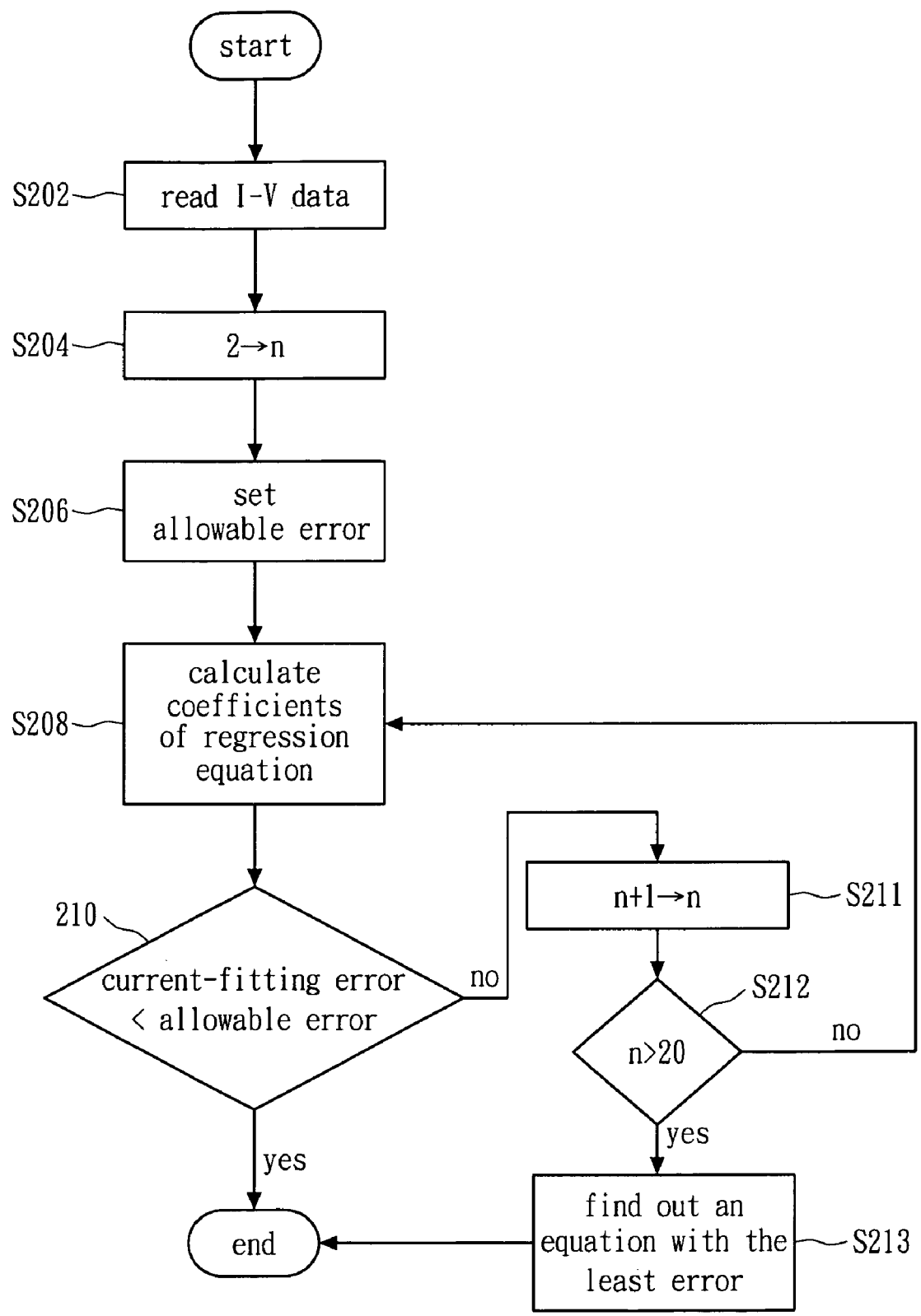
FIG. 2 shows a flow chart of an optimal characteristic curve-fitting algorithm.

FIG. 2 shows a flow chart of an optimal characteristic curve-fitting algorithm. The algorithm automatically generates I-V regression equations that satisfy the condition of a predetermined allowable curve-fitting error. In Step S202, the I-V curve data is read into the memory. The regression equation of the present invention is polynomial, such as a quadratic which starts to fit I-V curve data as shown in Step 204. In Step S206, an allowable error is set and all I-V polynomial regression equations that have curve-fitting errors smaller than the allowable error are taken to represent the I-V curves and are performed by later calculations.

In Step S208, the coefficients of the I-V polynomial regression equation is obtained based on the I-V data. The regression analysis is done by performing a least square approximation, and the I-V polynomial regression equation may be the following:

$$f(V) = a_0 + a_1 V + a_2 V^2 + \ldots + a_n V^n \tag{1}$$

wherein $a_0, a_1, a_2 \ldots a_n$ are coefficients of the I-V polynomial regression equation, while n is the power of the I-V polynomial regression equation. The I-V data and the equation (1) can infer to the following matrix equation:

$$R = X \cdot A + E \tag{2}$$

wherein $I_1, \ldots I_m$ and $V_1, \ldots V_m$ are I-V measured data; the element $e_k$ of the matrix E is residual between $I_k$ and $f(V_k)$.

$$R = \begin{bmatrix} I_1 \\ \vdots \\ I_m \end{bmatrix} \tag{3}$$

$$X = \begin{bmatrix} 1 & V_1 & \ldots & V_1^n \\ 1 & V_2 & \ldots & V_2^n \\ \vdots & \vdots & \vdots & \vdots \\ 1 & V_m & \ldots & V_m^n \end{bmatrix} \tag{4}$$

$$A = \begin{bmatrix} a_0 \\ \vdots \\ a_n \end{bmatrix} \tag{5}$$

$$E = \begin{bmatrix} e_1 \\ \vdots \\ e_m \end{bmatrix} \tag{6}$$

After completing the calculation of least square approximation, the coefficients of the polynomial regression equation are resolved as the following:

$$A = (X^t X)^{-1} \cdot X^t \cdot R \tag{7}$$

wherein $X^t$ is a transpose matrix of X, and $(X^t X)^{-1}$ is an inverse matrix of $(X^t X)$.

In Step S210, it is determined whether an I-V polynomial regression equation which satisfies the condition of an allowable error is found. The curve-fitting error of the I-V polynomial regression equation is calculated based on the following:

$$\varepsilon = \sqrt{\sum_{k=1}^{m} e_k^2} \tag{8}$$

If $\varepsilon$ is smaller than an allowable error, the I-V data is represented by the calculated I-V polynomial regression equation. If $\varepsilon$ is greater than the allowable error, it means that the calculated I-V polynomial regression equation is still unqualified to represent the I-V data, and then a new I-V polynomial regression equation with one more power is used to perform the next curve fitting of the I-V data as shown in Step 211.

In Step S212, it is determined whether the power of the I-V polynomial regression equation is greater than 20. This step is used to limit the amount of calculation. When the power is greater than 20, an I-V polynomial regression equation will not be used to conduct a curve fitting any more, but instead, one I-V polynomial regression equation with minimal curve-fitting error is chosen from the previously calculated I-V polynomial regression equations with powers between 2 and 20 to represent the I-V data as shown in Step S213.

Due to the limitation of errors, the I-V polynomial regression equation obtained by using the above optimal characteristic curve selection algorithm has more accurate characteristic parameters, and the whole procedure is deduced automatically so as to ensure a consistent and accurate manner.

Figure 3:
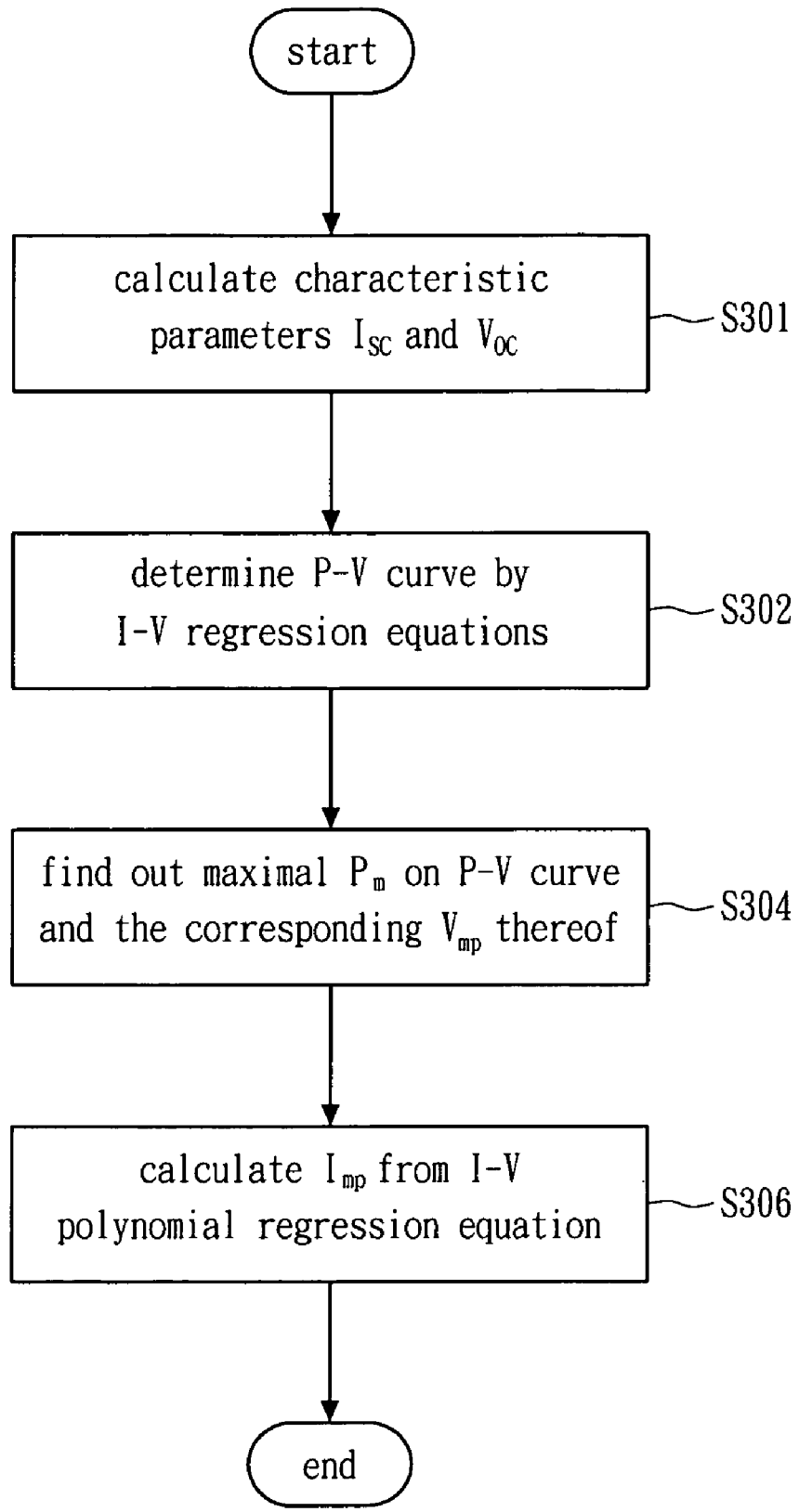
FIG. 3 shows a flow chart of parameter calculation in accordance with one embodiment of the present invention.

FIG. 3 shows a flow chart of parameter calculation in accordance with one embodiment of the present invention. In Step S301, characteristic parameters are calculated based on the I-V polynomial regression equation. Particularly, $I_{SC}$ is obtained based on f(0), and $V_{OC}$ is obtained based on f(V)=0. In Step S302, the I-V polynomial regression equation infers to a power-voltage (P-V) polynomial regression equation; that is, by multiplying voltage V at two sides of the equation.

In Steps S304 and S306, the P-V polynomial regression equation is differentiated by voltage V to generate the maximum of the P-V polynomial regression equation. That is, the maximal power voltage $V_{mp}$ is obtained first by numeric analysis, and then the maximal power $P_m$ and maximal power current $I_{mp}$ are obtained by the P-V polynomial regression equation and I-V polynomial regression equation.

Figure 4:
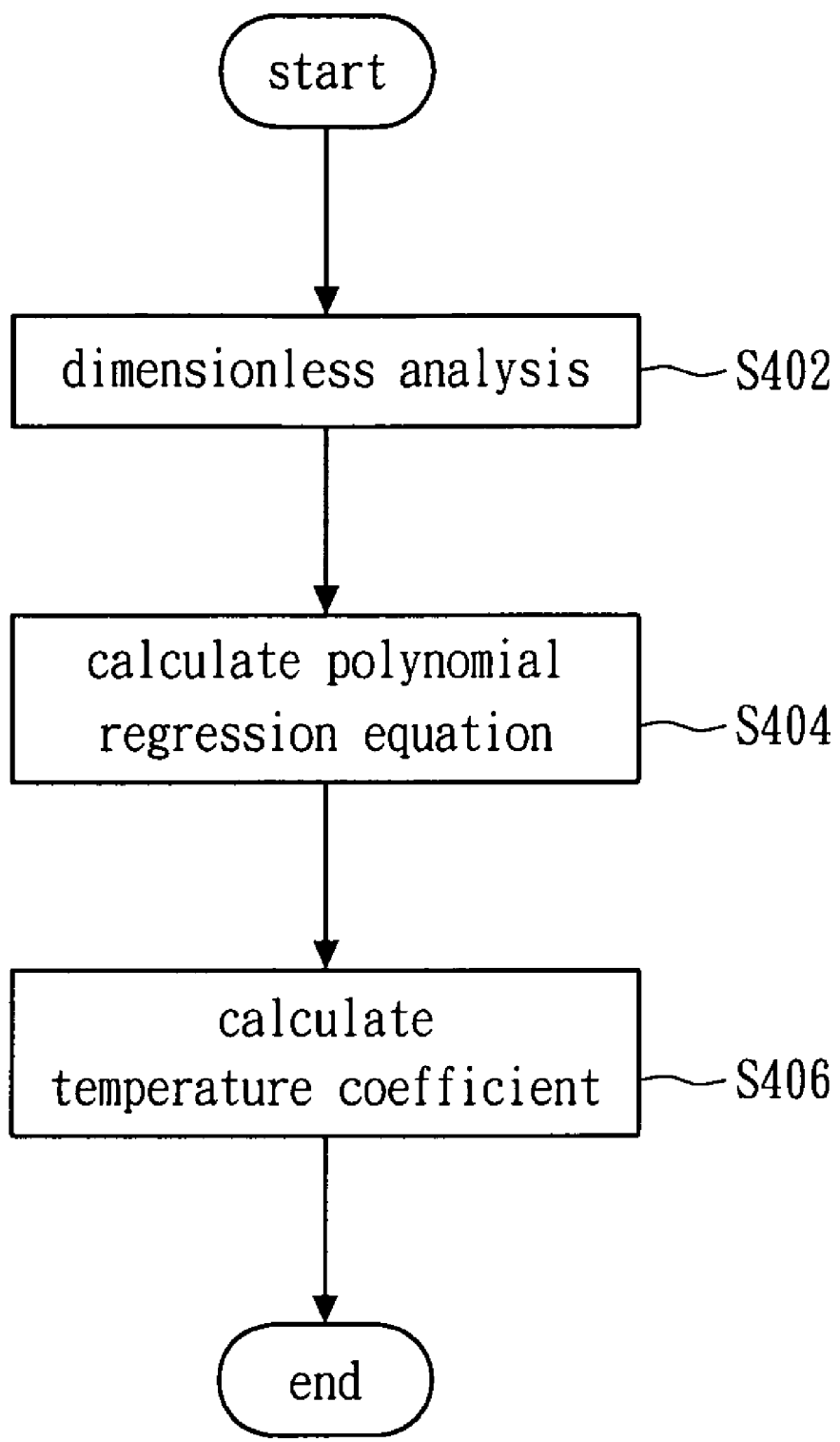
FIG. 4 shows a flow chart of a temperature coefficient calculation algorithm in accordance with one embodiment of the present invention.

FIG. 4 shows a flow chart of a temperature coefficient calculation algorithm in accordance with one embodiment of the present invention. In Step S402, $V_{oc}$ and $I_{sc}$ obtained in the flow chart of FIG. 3 are used to conduct a dimensionless analysis on I-V data. In Step S404, dimensionless I-V polynomial regression equation based on dimensionless I-V data is located by the flow chart of FIG. 2.

The transformation between I-V data and characteristic parameters with different temperature and/or illumination are conducted as the following:

$$I_2 = I_1 \times [1 + \alpha \times (T_2 - T_1)] \times \frac{E_2}{E_1} \quad (9)$$

$$V_2 = V_1 + V_{OC} \times \left[\beta \times (T_2 - T_1) + \delta \times \ln\left(\frac{E_2}{E_1}\right)\right] - R_S \times (I_2 - I_1) \quad (10)$$

wherein $I_1$ and $V_1$ are obtained in the conditions of temperature $T_1$ and illumination $E_1$, $I_2$ and $V_2$ are I-V data after $I_1$ and $V_1$ are transformed based on temperature coefficients $\alpha$, $\beta$, $\delta$ and internal in-series $R_S$ under temperature $T_2$ and illumination $E_2$. In Step S406, the temperature coefficients $\alpha$, $\beta$, $\delta$ and $R_S$ are calculated based on equations (9) and (10). The temperature coefficient $\alpha$ is the slope of the regression equation related to $I_{sc}$ under 1000 W/m2 at different temperature; that is, $\Delta I_{sc}/\Delta T$. The temperature coefficient $\beta$ is obtained by first calculating the slope of $V_{oc}$ to temperature T in every illumination, that is $\Delta V_{oc}/\Delta T$, standardizing by $V_{oc}$ and then by a linear regression equation based on $\Delta V_{oc}/\Delta T$ and illumination E. The temperature coefficient $\delta$ is obtained by first calculating the slope of Voc to ln(E) in every illumination, that is $\Delta V_{oc}/\Delta \ln(E)$, standardizing by $V_{oc}$ and then by a linear regression equation based on $\Delta V_{oc}/\Delta \ln(E)$ and temperature T.

Figure 5:
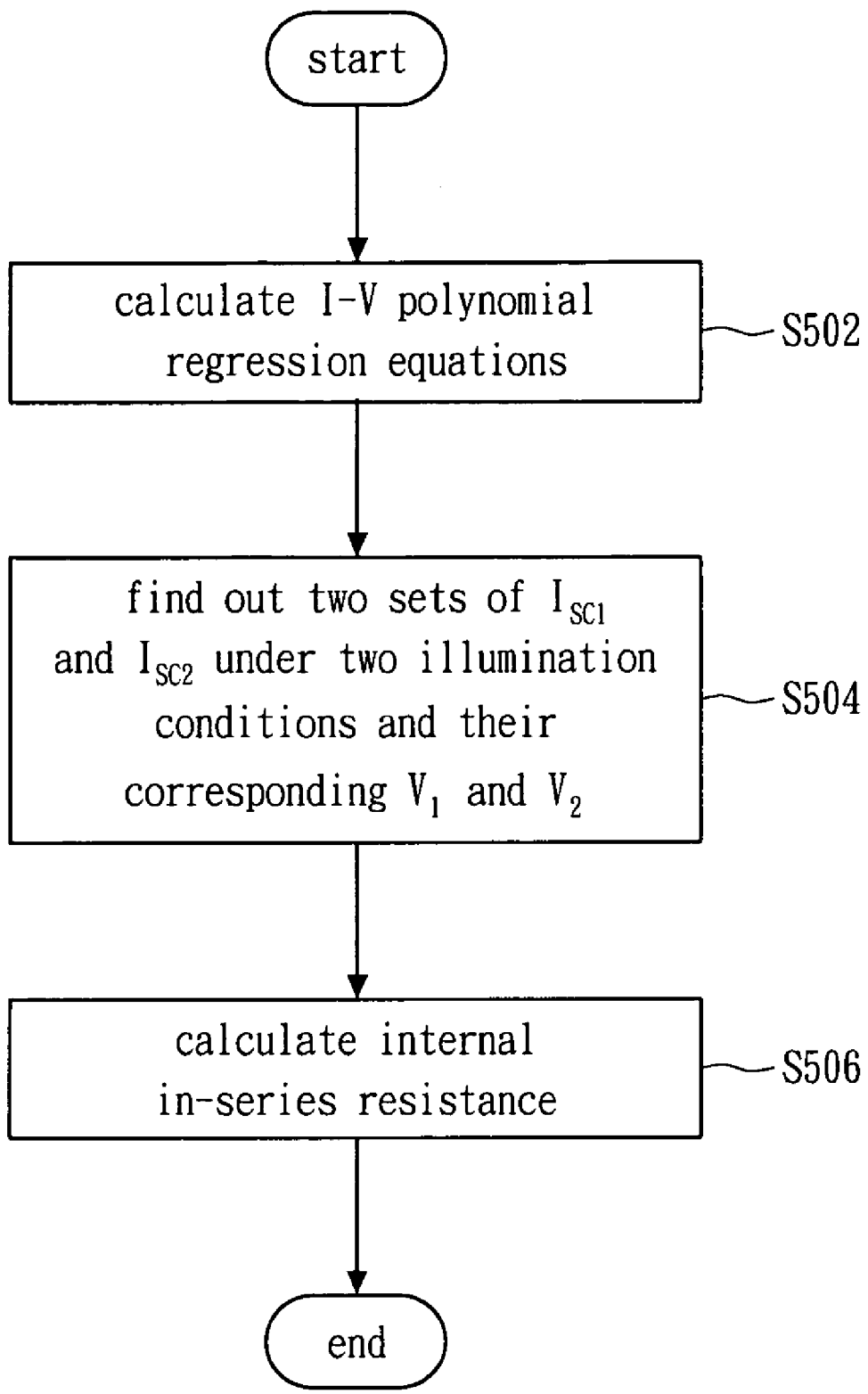
FIG. 5 shows a flow chart of calculating internal equivalent in-series resistance in accordance with one embodiment of the present invention.

FIG. 5 shows a flow chart of calculating internal equivalent in-series resistance in accordance with one embodiment of the present invention. In Step S502, an I-V polynomial regression equation corresponding to I-V data is located by the method of FIG. 2. In Step S504, $I_{sc1}$ and $I_{sc2}$ under two different illumination conditions and their corresponding voltage $V_1$ and $V_2$ are located. In Step S506, the internal equivalent in-series resistance $R_s$ is calculated as the following equation:

$$R_S = \frac{V_2 - V_1}{I_{SC2} - I_{SC1}} \quad (11)$$

The temperature coefficients $\alpha$, $\beta$, $\delta$ and $R_S$ can be used to transform I-V data and characteristic parameters under any condition into a standard test condition.

The above-described embodiments of the present invention are intended to be illustrative only. Numerous alternative embodiments may be devised by persons skilled in the art without departing from the scope of the following claims.

What is claimed is:

1. A computer implemented method for forming an optimal characteristic curve of a solar cell, comprising the steps of:
providing a first allowable error to a computer system;
determining a current-voltage polynomial regression equation in accordance with measured data of the solar cell using the computer system, wherein the order of the current-voltage polynomial regression equation is increased when a curve-fitting error of the current-voltage polynomial regression equation is smaller than the first allowable error;
calculating characteristic parameters including open voltage and short current in accordance with the current-voltage polynomial regression equation using the computer system;
determining a power-voltage polynomial regression equation in accordance with the current-voltage polynomial regression equation using the computer system; and
determining a maximal power voltage, maximal power and maximal power current in accordance with the power-voltage polynomial regression equation using the computer system.

2. The method of claim 1, wherein the power of the current-voltage polynomial regression equation is smaller than 20.

3. The method of claim 1, wherein the determining step includes a step of selecting a current-voltage polynomial regression equation with a minimal curve-fitting error from all calculated current-voltage polynomial regression equations.

4. The method of claim 1, further comprising the steps of:
utilizing the characteristic parameters to conduct a dimensionless analysis on the measured data of the solar cell;
providing a second allowable error;
determining a dimensionless current-voltage polynomial regression equation in accordance with the result of the dimensionless analysis, wherein the curve-fitting error of the dimensionless current-voltage polynomial regression equation is smaller than the second allowable error; and
utilizing the dimensionless current-voltage polynomial regression equation to calculate temperature parameters.

5. The method of claim 4, further comprising the steps of:
finding two sets of data related to short current and voltage corresponding to the short current at different illumination conditions; and
calculating an internal equivalent in-series resistance.

6. The method of claim 5, further comprising the steps of:
utilizing the temperature parameters and internal equivalent in-series resistance to transform the measured data and/or characteristic parameters of the solar cell into a standard test condition.

7. The method of claim 1, further comprising the steps of:
finding two sets of data related to short current and voltage corresponding to the short current at different illumination conditions; and
calculating an internal equivalent in-series resistance.

8. A non-transitory computer readable medium encoded with instructions that, when executed by a computer system, performs a method for forming an optimal characteristic curve of a solar cell, comprising the steps of:
providing a first allowable error to the computer system;
determining a current-voltage polynomial regression equation in accordance with measured data of the solar cell using the computer system, wherein the order of the current-voltage polynomial regression equation is increased when a curve-fitting error of the current-voltage polynomial regression equation is smaller than the first allowable error;
calculating characteristic parameters including open voltage and short current using the computer system;

estimating a power-voltage polynomial regression equation using the computer system; and estimating maximal power voltage, maximal power and maximal power current using the computer system.

9. The method of claim 8, further comprising the steps of:

utilizing the characteristic parameters to conduct a dimensionless analysis on the measured data of the solar cell;

providing a second allowable error;

determining a dimensionless current-voltage polynomial regression equation in accordance with the result of the dimensionless analysis, wherein the curve-fitting error of the dimensionless current-voltage polynomial regression equation is smaller than the second allowable error; and utilizing the dimensionless current-voltage polynomial regression equation to calculate temperature parameters.

10. The method of claim 9, further comprising the steps of:

finding two sets of data related to short current and voltage corresponding to the short current at different illumination conditions; and calculating an internal equivalent in-series resistance.

11. The method of claim 10, further comprising the steps of:

utilizing the temperature parameters and internal equivalent in-series resistance to transform the measured data and/or characteristic parameters of the solar cells into a standard test condition.

12. A system of forming an optimal characteristic curve of a solar cell, comprising:

a memory unit, wherein the memory unit comprising;

a current-voltage polynomial regression module configured to determine polynomial regression equations with errors smaller than an allowable error in accordance with measured data of the solar cell;

a characteristic parameter calculation module configured to calculate characteristic parameters including open voltage and short current in accordance with the current-voltage polynomial regression equations;

a temperature coefficient calculation module configured to calculate temperature coefficients on the basis of the relationship of dimensionless characteristic parameters and temperature as well as illumination, wherein the dimensionless characteristic parameters are determined by conducting a dimensionless analysis on the measured data of the solar cell in accordance with the characteristic parameters;

an internal in-series resistance calculation module configured to calculate internal in-series resistance in accordance with the short current and voltage corresponding to the short current at different illumination conditions; and a characteristic parameter transformation module configured to transform the measured data and/or characteristic parameters of the solar cell into a standard test condition.

13. The system of claim 12, further comprising;

the memory unit configured to store data of the current-voltage polynomial regression module, characteristic parameter calculation module, temperature coefficient calculation module, internal in-series resistance calculation module and characteristic parameter transformation module; and a processing module coupled to the memory unit for executing instructions;

Authorization for this examiner's amendment was given in a telephone interview with Mr. Anthony King on Apr. 24, 2012.

14. The system of claim 13, wherein the memory unit includes volatile memory and non-volatile memory.

15. The system of claim 13, wherein the processing unit is a micro-controller or a microprocessor.

16. The system of claim 12, further comprising an output device selected from one of a monitor and a printer.

17. The system of claim 12, further comprising an input device for storing measured data of the solar cell.

18. The system of claim 17, wherein the input device is a hard disk, optical storage device or a register.

* * * * *